United States Patent [19]
Hao

[11] Patent Number: 5,966,586
[45] Date of Patent: Oct. 12, 1999

[54] ENDPOINT DETECTION METHODS IN PLASMA ETCH PROCESSES AND APPARATUS THEREFOR

[75] Inventor: Fangli Hao, Cupertino, Calif.

[73] Assignee: Lam Research Corporation, Fremont, Calif.

[21] Appl. No.: 08/938,082

[22] Filed: Sep. 26, 1997

[51] Int. Cl.⁶ .................................................. H01L 21/00
[52] U.S. Cl. ..................................... 438/7; 438/9; 438/14; 438/18; 438/710; 438/714
[58] Field of Search ............................. 438/7, 9, 14, 18, 438/710, 714

[56] References Cited

U.S. PATENT DOCUMENTS

| | | | |
|---|---|---|---|
| 4,415,402 | 11/1983 | Gelernt et al. | 156/626 |
| 4,496,425 | 1/1985 | Kuyel | 156/626 |
| 5,885,472 | 3/1999 | Miyazaki et al. | 216/60 |

*Primary Examiner*—Benjamin Utech
*Assistant Examiner*—Vanessa Perez-Ramos
*Attorney, Agent, or Firm*—Beyer & Weaver, LLP

[57] ABSTRACT

Methods for determining an endpoint for a plasma etching process. The plasma etching process is employed to etch a substrate in a plasma processing chamber. The method includes detecting, using a mass analyzer, a density of a predefined compound in the plasma processing chamber. The method further includes outputting from the mass analyzer a variable signal responsive to the detecting. There is also included producing, responsive to the variable signal, a control signal. The control signal is outputted when a predefined density criteria is detected in the variable signal. Additionally, there is included initiating an etch termination procedure, responsive to the control signal, thereby ending the plasma etching process at an end of the etch termination procedure.

16 Claims, 4 Drawing Sheets

ENDPOINT DETECTION METHODS IN PLASMA ETCH PROCESSES AND APPARATUS THEREFOR

BACKGROUND OF THE INVENTION

The present invention relates to the processing of a substrate in the manufacture of integrated circuits. More particularly, the present invention relates to methods and apparatus for determining an endpoint for a plasma etching process in a plasma processing chamber during the processing of semiconductor substrates.

Substrates, e.g., wafers or glass panels, are widely used in the production of electronic devices. By depositing layers of selected materials and etching those layers in accordance with predefined patterns, integrated circuits and flat panel displays may be formed out of wafers and glass panels respectively. Although wafers, and in particular silicon wafers, are mentioned throughout this disclosure to simplify discussion, it should be borne in mind that the invention disclosed herein applies to any kind of substrate, including wafers made out of other materials (e.g., GaAs) as well as glass panels.

Silicon wafers are typically manufactured using plasma processing chambers to perform plasma etching processes during the manufacture of the silicon wafer. These plasma-enhanced etching processes are well known to those skilled in the art. An important aspect of the etching process is properly determining the point at which the plasma etching process is complete. This point at which the etching process is complete is referred to as the endpoint for the etching process. If the etching process proceeds for too long, over etching occurs which may damage the integrated circuit. On the other hand, stopping the etching process too early may result in an incomplete etch which may prevent the proper formation of features in the integrated circuit required to produce a good integrated circuit. As the size or critical dimension of integrated circuits is reduced below the sub micron level, the proper determination of the endpoint of the etching process becomes more and more difficult.

In the past, the endpoint for a particular etching process has been determined by test etching a number of test wafers in order to determine the length of time required for the etching process to etch through the desired layers of the wafer using a specific regime of pressure, flow rates, and flow ratios of etchants. Once this length of time was determined, it was used to determine the endpoint of the etching process. However, because of variations in the thickness of various layers from wafer to wafer and because of variations in the etching rate, this approach of using a predetermined length of time to control the etching process is not very reliable, especially in the case of wafers designed with small critical dimensions.

More recently, optical emission detectors and optical signal analysis have been used to determine the endpoint of certain etching processes. FIG. 1 illustrates a plasma processing system 100 including this type of an optical emission detecting arrangement. Plasma processing system 100 includes a plasma processing chamber 102. System 100 has a gas line 104 connected to a shower head 106 in chamber 102 for releasing etchant gases into the chamber. A chuck 108 is used to support a silicon wafer 110 during the processing of the wafer. In order to monitor the wafer during the processing of the wafer, chamber 102 also includes a window 112. Window 112 allows light, indicated by arrow 114, that is produced by the reactions within chamber 102 to be detected by optical sensors outside of the chamber.

As illustrated in FIG. 1, system 100 includes an optical sensor 116 for measuring the intensity of light 114 emitted through window 112 during the etching process. Optical sensor 116 produces an electrical signal indicated by arrow 118 which represents the intensity of light 114. A computer 120 uses a detection algorithm and electrical signal 118 to determine the endpoint for the etching process. Computer 120 generates an endpoint signal indicated by arrow 122 which is sent to a chamber controller 124. Controller 124 uses endpoint signal 122 to stop the etching process and moves on to the next step in the processing of the wafer.

As is known in the art, system 100 also includes energy sources for striking a plasma within chamber 102 and an arrangement for exhausting the byproducts of the etching process. In the embodiment shown, RF sources 126 and 128 are used to respectively energize shower head 106 and chuck 108 in order to strike a plasma within chamber 102. Also, an exhaust port 130 is used to exhaust the byproducts of the etching process as the byproducts are produced. Typically, a turbo pump or other such device is used to draw any byproducts of the etching process from chamber 102.

During the etching process, etch species and reactants in the processing chamber emit light when their excited electrons change energy states. Each species produces a unique wavelength of light, and the intensity of each wavelength of light emitted from the plasma is related to the concentration of that species within the plasma. As a wafer is being etched, a reaction equilibrium is generally sustained within the plasma until the layer which is being etched starts to clear or be filly removed. At this point, the increase in the concentration of the etchant species and the decrease in the concentration of the reaction product species causes the light intensities associated with these species to increase or decrease. By measuring the light emission intensity change associated with the chemical species in the plasma, an endpoint for the etching process can be determined.

Two types of endpoint determination methods are currently in use. The first and most common is the threshold method of determining the endpoint. In this method, a sensor is used to detect the intensity of a certain wavelength of light which is produced by one of the reactants of the etching process. Generally, when the intensity of the wavelength of light crosses a predetermined threshold, the computer signals that the endpoint has been reached. In the second method, the shape of a curve representing the changes in the intensity of a particular wavelength of light which is produced by one of the reactants is used to determine the endpoint. In this method, the computer monitors the electrical signal provided by the optical sensor and compares the shape of the signal over time to a predetermined shape. Once a match is found, the computer signals the endpoint for the etching process Optical emission detection arrangements such as the ones described above have several drawbacks which may make them costly and unreliable. In a first example of the drawbacks of this approach, the window in the chamber will typically become cloudy after a relatively short period of time. This is caused by deposits of polymers or other reaction products within the plasma on the inner surface of the window. Because the optical emission method uses the intensity of light emitted from the chamber to determine the endpoint of the process, a cloudy window can substantially reduce the intensity of the signal causing inaccurate readings. These inaccurate readings can cause the system to indicate the endpoint at the wrong time resulting in damaged and unusable wafers. In many cases, this clouding of the window will occur in as few as 2000 minutes of operation of the chamber. This means that the system must be shut down and cleaned regularly substantially reducing the throughput for the system and increasing the costs of producing the wafers.

As a second drawback, as the critical dimensions of the devices being produced on the wafer become smaller and smaller, the optical signals or light produced by the reactants becomes weaker and weaker. This makes it more and more difficult to discriminate between the background noise (e.g. light from other sources) and the light produced by the reactant which is being used to detect the endpoint. This may result in not detecting the proper endpoint and may significantly reduce the yield for a given etching process. Because of the very high cost of producing wafers with complex integrated circuits, this reduced yield can be very costly.

As another disadvantage, using either the threshold or the shape method of detecting the endpoint requires a large number of wafers to be tested in order to establish an acceptable range of conditions within which the endpoint may be determined. This is because there is always some variation from wafer to wafer or in the flow rates and reaction rates of the etching process. In order to deal with these variations, a large number of test wafers are etched in order to establish a statistically acceptable range of conditions within which the endpoint is to be identified. In many cases, hundreds to thousands of wafers may be run to establish the desired range. This can again significantly increase the costs of processing the desired wafers.

As another example of the disadvantages of the optical emission approach to detecting the endpoint of the etching process, variations from wafer to wafer and/or the use of a complicated process in which many reactants are involved may make it impossible to find an acceptable range of conditions that can be used to identify the endpoint of the process. If this is the case, the approach of using a predetermined length of time to control the etching must be used. However, as mentioned above, the use of this approach may cause a large number of bad wafers to be produced thereby increasing the costs of processing the wafers.

In view of the foregoing, there are desired improved methods and apparatus for more accurately determining the endpoint of a plasma-enhanced etch process.

SUMMARY OF THE INVENTION

The invention relates, in one embodiment, to a method for determining an endpoint for a plasma etching process. The plasma etching process is employed to etch a substrate in a plasma processing chamber. The method includes detecting, using a mass analyzer, a density of a predefined compound in the plasma processing chamber. The method further includes outputting from the mass analyzer a variable signal responsive to the detecting. There is also included producing, responsive to the variable signal, a control signal. The control signal is outputted when a predefined density criteria is detected in the variable signal. Additionally, there is included initiating an etch termination procedure, responsive to the control signal, thereby ending the plasma etching process at an end of the etch termination procedure.

In another embodiment, the invention relates to a method for determining an endpoint for a plasma etching process. The plasma etching process is employed to etch a substrate in a plasma processing chamber. The method includes directing a beam of light through a region of the plasma processing chamber during the plasma etching process. The region contains byproducts of the plasma etching process, compounds of the byproducts having different light absorbing characteristics. The method further includes detecting an intensity of the beam of light after the beam of light passes through the region and generating from the detecting a variable signal representative of a density of a predefined compound of the compounds in the byproducts. There is also included producing, responsive to the variable signal, a control signal. The control signal being outputted when a predefined density criteria is detected in the variable signal. Additionally, there is included initiating an etch termination procedure, responsive to the control signal, thereby ending the plasma etching process at an end of the etch termination procedure.

In yet another embodiment, the invention relates to a method for determining an endpoint for a plasma etching process. The plasma etching process is employed to etch a substrate in a plasma processing chamber. The method includes employing a first endpoint sensor to determine a first endpoint of the plasma etching process. There is also included employing a second endpoint sensor different from the first endpoint sensor to determine a second endpoint of the plasma etching process. Further, there is included ascertaining whether the first endpoint and the second endpoint are ascertained within a predefined time period. Additionally, there is included initiating an etch termination procedure if the first endpoint and the second endpoint are ascertained within the predefined time period.

These and other features of the present invention will be described in more detail below in the detailed description of the invention and in conjunction with the following figures.

BRIEF DESCRIPTION OF THE DRAWINGS

The features of the present invention may best be understood by reference to the following description of the presently preferred embodiments together with the accompanying drawings.

DETAILED DESCRIPTION OF THE PREFERRED EMBODIMENTS

An invention is described herein for providing a method and apparatus for determining the endpoint of a plasma etching process performed on a silicon wafer in a plasma processing chamber. In the following description, numerous specific details are set forth in order to provide a thorough understanding of the present invention. However, it will be obvious to one skilled in the art that the present invention may be embodied in a wide variety of specific configurations. Also, well known plasma etching processes and other processes associated with the production of integrated circuits on silicon wafers will not be described in detail in order not to unnecessarily obscure the present invention.

The inventive endpoint determining technique may be performed in any known plasma processing apparatuses such as, but not limited to, those adapted for dry etching, plasma etching, reactive ion etching, magnetically enhanced reactive ion etching, electron cyclotron resonance, or the like. Note that the this is true irrespective of whether energy to the plasma is delivered through capacitively coupled parallel electrode plates, through ECR microwave plasma sources, or through inductively coupled RF sources such as helicon, helical resonators, and transformer coupled sources. These processing systems, among others, are readily available commercially.

Figure 2:
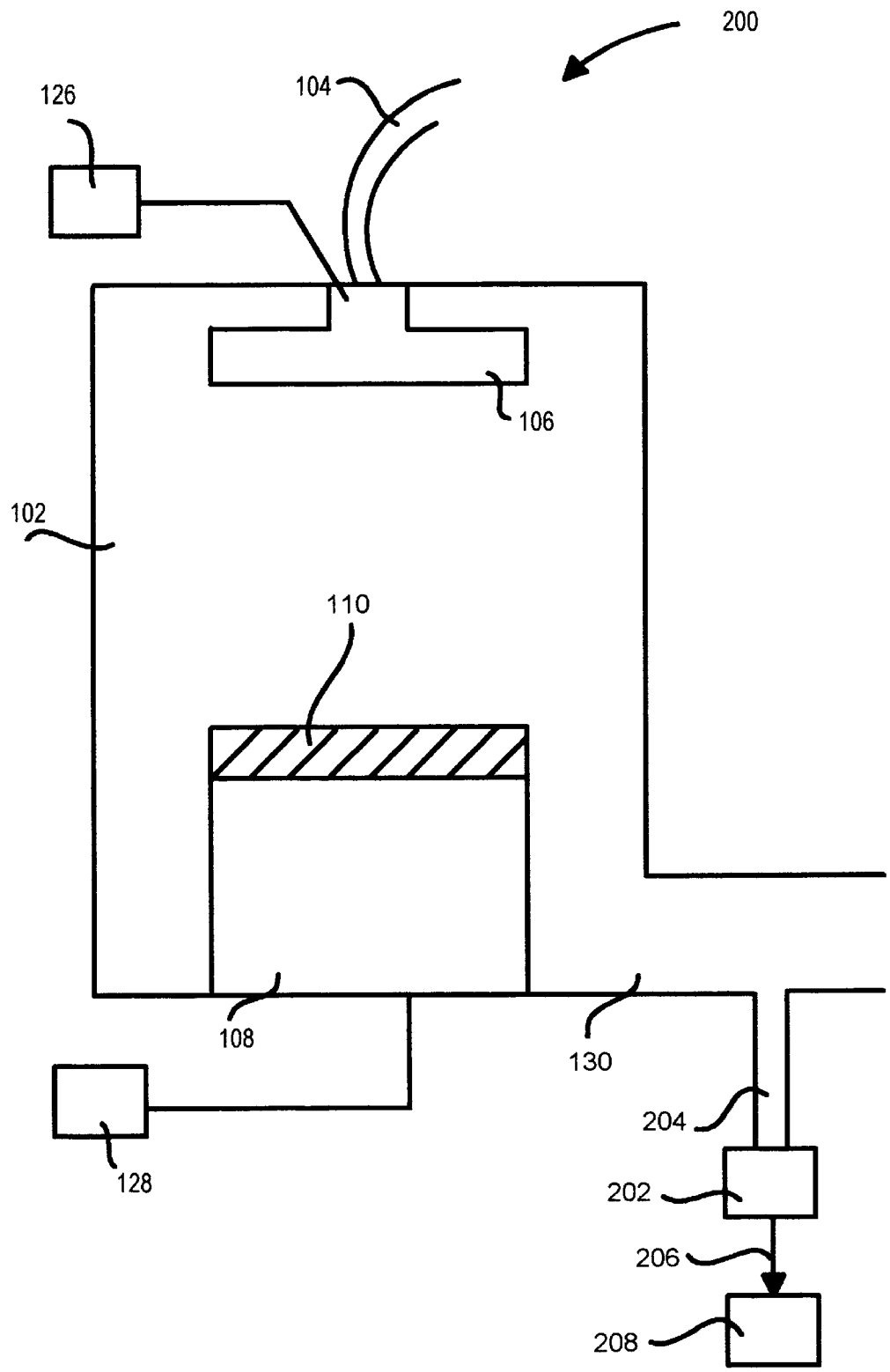
FIG. 2 is an cross sectional view of a plasma processing chamber designed in accordance with the invention including a mass analyzer for detecting the endpoint of a plasma etching process.

FIG. 2 illustrates a simplified schematic of a plasma processing system 200 designed in accordance with the present invention. For illustrative purposes, like reference numerals will be used throughout the various figures for like components. Generally, system 200 is a system similar to system 100 described above. That is, system 200 includes plasma processing chamber 102 with gas line 104 connected to shower head 106 in chamber 102 for releasing etchant gases into the chamber. As described above for system 100, chuck 108 is used to support a silicon wafer 110 during the processing of the wafer and exhaust port 130 is used to exhaust the byproducts of the etching process from chamber 102. Although not shown in FIG. 2, one or more test ports or view ports may also be provided.

In the embodiment illustrated in FIG. 2, system 200 also includes RF source 126 coupled to shower head 106 and RF source 128 coupled to chuck 108. These RF sources are used to strike a plasma within chamber 102. Although system 200 is described as including RF sources 126 and 128, this is not a requirement. Instead, as described above, it should be understood that the present invention would equally apply regardless of the specific arrangement and power source used to strike the plasma within the chamber.

In accordance with the invention and as will be described in more detail hereinafter, system 200 further includes a mass analyzer 202. In this embodiment, mass analyzer 202 is connected to exhaust port 130 by a sampling port 204. Sampling port 204 allows mass analyzer 202 to be able to sample the gases that are being exhausted through exhaust port 130. Although mass analyzer is described as being connected to exhaust port 130, this is not a requirement. Instead, mass analyzer 202 may be connected to system 200 in any way so long as mass analyzer 202 is able to sample the byproducts of the etching process as they are being produced. For example, mass analyzer 202 may be connected to system 200 such that it samples the byproducts of the etching process directly from chamber 102 rather than from exhaust port 130.

Mass analyzer 202 may be any suitable and readily available mass analyzer designed to be capable of detecting compounds that are produced as byproducts of the etching process. In a preferred embodiment, mass analyzer 202 is a mass analyzer such as the QualiTorr® Orion® series of mass analyzers provided by MKS Instruments of San Jose, Calif. Other mass analyzers, such as the M5250 or the MEXM0500b (available from the ABB Extrel company of Pittsburgh, Pa.), or any other suitable mass analyzer may also be used.

As illustrated in FIG. 2, mass analyzer 202 produces an output signal indicated by arrow 206. This output signal represents the presence of various compounds that make up the exhaust gases that are produced as byproducts of the etching process and are exhausted from the chamber. Signal 206, which may be a continuously variable signal, is provided to a controller or computer 208 which is used to control the operation of system 200. In accordance with the invention, controller 208 uses signal 206 to determine when the endpoint of the etching process has been reached by detecting a predetermined density criteria in signal 206. This predefined density criteria indicates a change in the compounds making up the byproducts of the etching process.

As described above in the background, the reactants of the etching process generally maintain an equilibrium as the wafer is being etched. This equilibrium is maintained until the exposed portions of the layer which are being etched start to clear or be fully removed. At this point, the concentration of the etchant species increases and the concentration of the reaction product species decreases. Alternatively, if the etching process begins to etch into an underlying layer of the wafer formed from a different material, the reaction product species will begin to change. These changes may be reflected in a predefined density criteria to ascertain, from variable signal 206, when to terminate the etch. If the predefined density criteria is ascertained, controller 208 may output a control signal to begin the etch termination procedure, which may immediately terminate the etch or may, if desired, extend the etch some predefined time duration to achieve overetch.

By way of example, a control signal may be outputted when the density threshold of a given compound is detected (such as when the density of the byproduct decreases to a certain threshold or when the density of the etching source gas increases to a certain threshold). As another example, the control signal may be outputted when the change (either increase or decrease) in the density of a predefined compound reaches a certain level. As yet another example, the control signal may be outputted when the shape of variable signal 206 matches a predefined shape. In a preferred embodiment, the predefined density criteria in variable signal 206 are obtained by running test etches on a test wafers.

This novel approach of using a mass analyzer to detect changes in the compounds making up the byproducts of the etching process has several advantages over the prior art optical emission method described above in the background. For example, the use of a mass analyzer eliminates the need to use a window to observe the optical emissions of the etching process. Therefore, the problems associated with the clouding of the window described above are completely eliminated. This eliminates the need to shut down the system regularly for cleaning of the window. Also, the mass analyzer detects various compounds by identifying the mass or density of selected compounds analyzed by the analyzer. This means that the mass analyzer approach is unaffected by optical background noise caused by the plasma etching process as is the case for the optical emission approach. In many cases, this elimination of the background noise problem makes the mass analyzer approach much more reliable compared to the optical emissions approach.

In another advantage, the mass analyzer approach may be used for very complicated processes in which it would be difficult or impossible to identify useful threshold or shape characteristics needed to trigger an endpoint using the optical emission approach. This is because mass analyzers are very accurate at ascertaining the mass or density of a specific compound and are therefore relatively unaffected by the level of complexity associated with the etch process. By way of example, modern mass analyzers have resolutions within 10 parts per billion or better. As another example, some mass analyzers are capable of monitoring multiple independent species, e.g., up to ten different kinds of species, simultaneously. These advantages of the mass analyzer approach make this approach very reliable.

Because the mass analyzer approach eliminates the cloudy window problem and the background noise problem, and because it is very accurate at identifying the mass or density of compounds analyzed, the mass analyzer approach substantially reduces the number of test wafers that must be run in order to identify the proper circumstances that may be used to determine the endpoint of the etching process. For example, in the case of using the optical emission approach to determine the endpoint of the etching process, typically hundreds or thousands of test wafers are run in order to obtain an acceptable range of circumstances that can be used to detect the endpoint of the etching process. However, using the mass analyzer approach, only a few test wafers (for example less than ten test wafers) will typically provide sufficient information to identify the circumstances that can be used to determine the endpoint of the etching process. This substantial reduction in the number of test wafers required to properly identify the endpoint of the etching process significantly reduces the overall cost of processing a given type of wafer.

Figure 3:
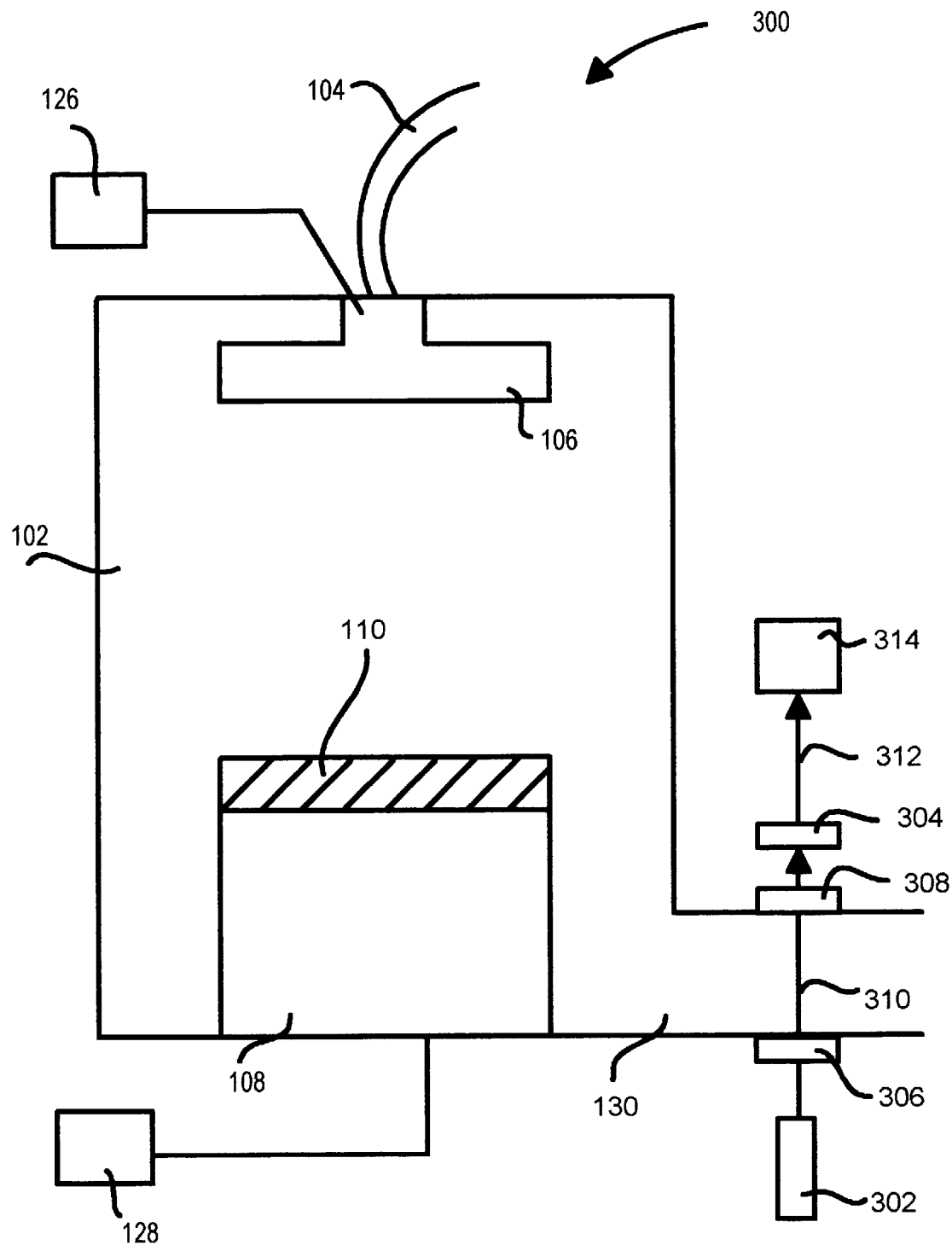
FIG. 3 is an cross sectional view of a plasma processing chamber designed in accordance with the invention including an arrangement having a light source and a light detector for detecting the endpoint of a plasma etching process.

Referring now to FIG. 3, another embodiment of the invention will be described. FIG. 3 illustrates a simplified schematic of a plasma processing system 300 designed in accordance with the present invention. As was the case for the previously described systems, system 300 includes plasma processing chamber 102 with gas line 104 connected to shower head 106 in chamber 102 for releasing etchant gases into the chamber. As described above for both systems 100 and 200, chuck 108 is used to support a silicon wafer 110 during the processing of the wafer and exhaust port 130 is used to exhaust the byproducts of the etching process from chamber 102. System 300 also includes RF source 126 coupled to shower head 106 and RF source 128 coupled to chuck 108. As mentioned above, the use of RF sources is not a requirement of the invention.

In accordance with the invention and as will be described in more detail hereinafter, system 300 further includes a light source 302, a light detector 304, and two windows 306 and 308. In this embodiment, windows 306 and 308 are located in opposite walls of exhaust port 130. Light source 302 is positioned adjacent to window 306 and light detector 304 is positioned adjacent window 308 such that light source 302 is able to direct a beam of light through exhaust port 130 into light detector 304 as indicated by arrow 310. Although the windows, light source, and light detector are described as being located such that the light source directs a beam of light through the exhaust port, this is not a requirement. Instead, these components may be located such that the light source directs a beam of light through any portion of system 300 so long as the beam of light passes through a region of the system that contains byproducts of the etching process as those byproducts are being produced by the etching process. For example, light source 302, light detector 304, and windows 306 and 308 may be located in system 300 such that they direct a beam of light from one side of plasma processing chamber 102 to the other side of the chamber rather than through exhaust port 130.

In a preferred embodiment, light source 302 takes the form of a laser. Although the light source is described as being a laser, this is not requirement. Instead any suitable light source may be utilized. However, preferably, the light source generates a focused beam of light having a specific known wavelength of light that is at least partially absorbed by one of the reactants of the plasma etching process. In the case of a laser, the laser may be any suitable and readily available laser designed to produce a beam of light having a wavelength of light that is at least partially absorbed by one of the reactants of the plasma etching process.

As illustrated in FIG. 3, light source 302 directs a beam of light of a given wavelength into exhaust port 130 through window 306 as indicated by arrow 310. When certain compounds or reactants making up the byproducts of the etching process are exhausted through exhaust port 130, specific compounds or reactants which absorb light of the given wavelength absorb a portion of the beam of light passing through exhaust port 130. The remaining portion of the beam of light passes through window 308 to light detector 304. Light detector 304 detects the intensity of this remaining portion of the beam of light and outputs a signal, indicated by arrow 312. The relative strength of this output signal represents the density of compounds or reactants that are capable of absorbing the given wavelength of light generated by light source 302.

Signal 312 may then provided to a controller circuit or computer 314 which is used to control the operation of system 300. In accordance with the invention, controller 314 uses signal 312 to ascertain from signal 312 a predefined density criteria (various examples of which have been described earlier in connection with FIG. 3) and to output a control signal. The control signal may be employed to initiate an etch termination procedure, which may immediately terminate the etch process or may, if desired, terminate the etch process after some predefined time duration to achieve the desired etch effect (e.g., overetch).

As described above in the background, specific reactants of the etching process emit light of a specific wavelength when their excited electrons change state. These reactants are also capable of absorbing light of a specific wavelength by having the electrons change state again. Directing a beam of light of a specific wavelength through the exhaust port as described above causes some of the electrons of the specific reactant to change state thereby absorbing some of the beam of light. This is another phenomenon which causes a change in the amount of light that reaches the light detector.

This novel light absorbing approach of directing a light source into the etchant gases to measure the amount of light absorbed by the gases in order to detect changes in the compounds making up the byproducts of the etching process has several advantages over the prior art optical emission method described above in the background. For example, the use of a light source reduces the problem associated with the clouding of the window. This is because the intensity of the light may be steadily increased to compensate for the clouding problem. In the case of the optical emission method of the prior art, the intensity of light produced is limited by the reactions of the reactant being measured. Also, the light source of the present invention produces a controlled a beam of light which is directed through the gases into a light detector at a known location. On the other hand, the optical emission method randomly emits light in all directions so that only a small portion of the emitted light emitted passes through the window. This means that the windows for the light absorbing method of the present invention may be much smaller than the window used for the prior art optical emission method. Because the windows can be smaller, they may be heated fairly easily and maintained at a high temperature which further reduces the clouding problem.

Also, since the beam of light is directed through the gases to a known location, this approach is not nearly as affected by optical background noise caused by the plasma etching process as is the case for the optical emission approach. In many cases, this reduction of the background noise problem makes the light absorbing approach of the present invention much more reliable compared to the conventional optical emissions approach.

In another advantage, the light absorbing approach may be used for very complicated processes in which it would be difficult or impossible to identify useful threshold or shape characteristics needed to trigger an endpoint using the conventional optical emission approach. This is because the beam of light is not affected by the complexity of the reactions within the chamber. Instead, this approach simply measures the amount of a specific wavelength of light that is absorbed as the light passes through the reactant gases.

Because the light absorbing approach reduces the cloudy window problem and the background noise problem, and because it is specifically configured to detect a the presence of a specific compound within the reactant gases, the light absorbing approach also substantially reduces the number of test wafers that must be run in order to identify the proper circumstances that may be used to determine the endpoint of the etching process. For example, as described above, typically hundreds or thousands of test wafers may need to be run in order to obtain an acceptable range of circumstances that can be used to detect the endpoint of the etching process in the case of using the optical emission approach. However, using the light absorbing approach, only a few test wafers may provide sufficient information to identify the circumstances that can be used to determine the endpoint of the etching process. This reduction in the number of test wafers required to identify the endpoint of the etching process reduces the overall cost of processing a given type of wafer.

In another aspect of the invention, a plurality of independent sensors are used to independently determine the endpoint of the etching process. In accordance with the invention, the endpoint of the etching process is identified only when at least two independent sensors indicate that the endpoint has been detected. This approach substantially improves the reliability of the identification process thereby improving the yield for wafers processed using this approach.

Figure 1:
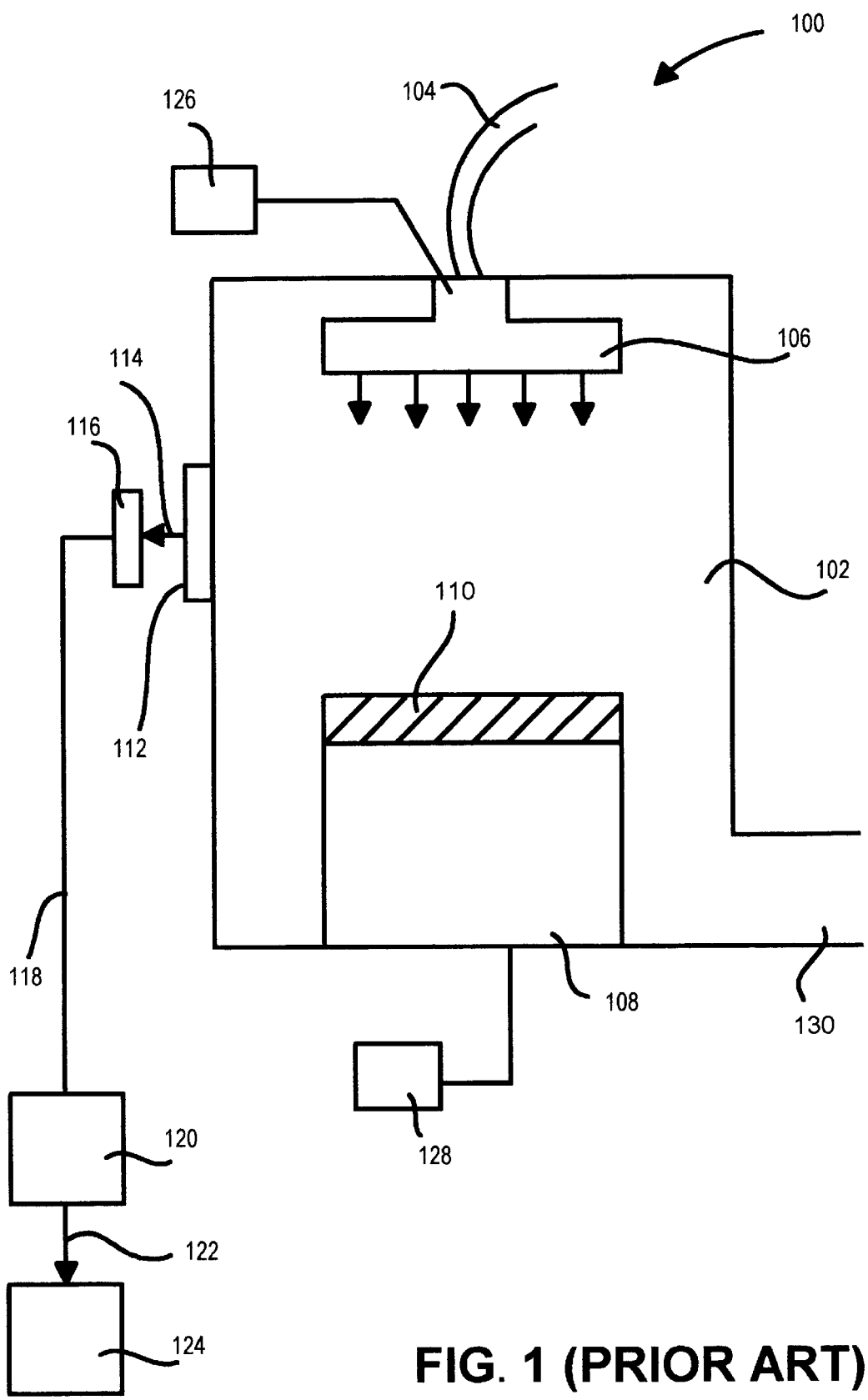
FIG. 1 is a simplified cross-sectional view of a prior art plasma processing chamber including a optical emission detector arrangement for detecting the endpoint of a plasma etching process.
Figure 4A:
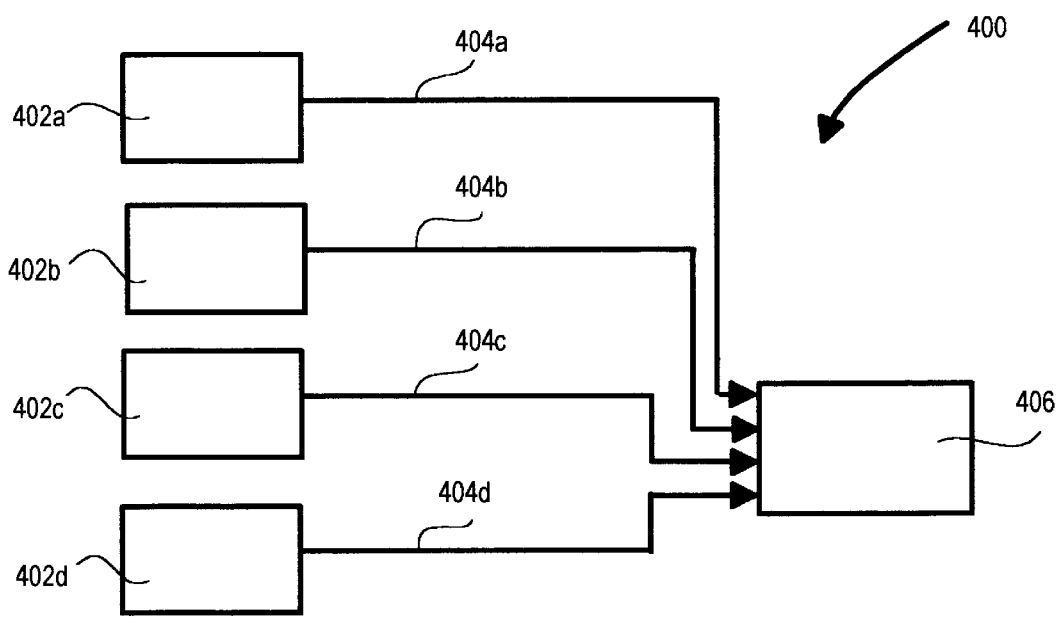
FIG. 4 is a flow diagram illustrating the operation of a plasma processing chamber designed in accordance with the invention including a plurality of independent sensors used to detect and determine the endpoint of a plasma etching process.
Figure 4B:
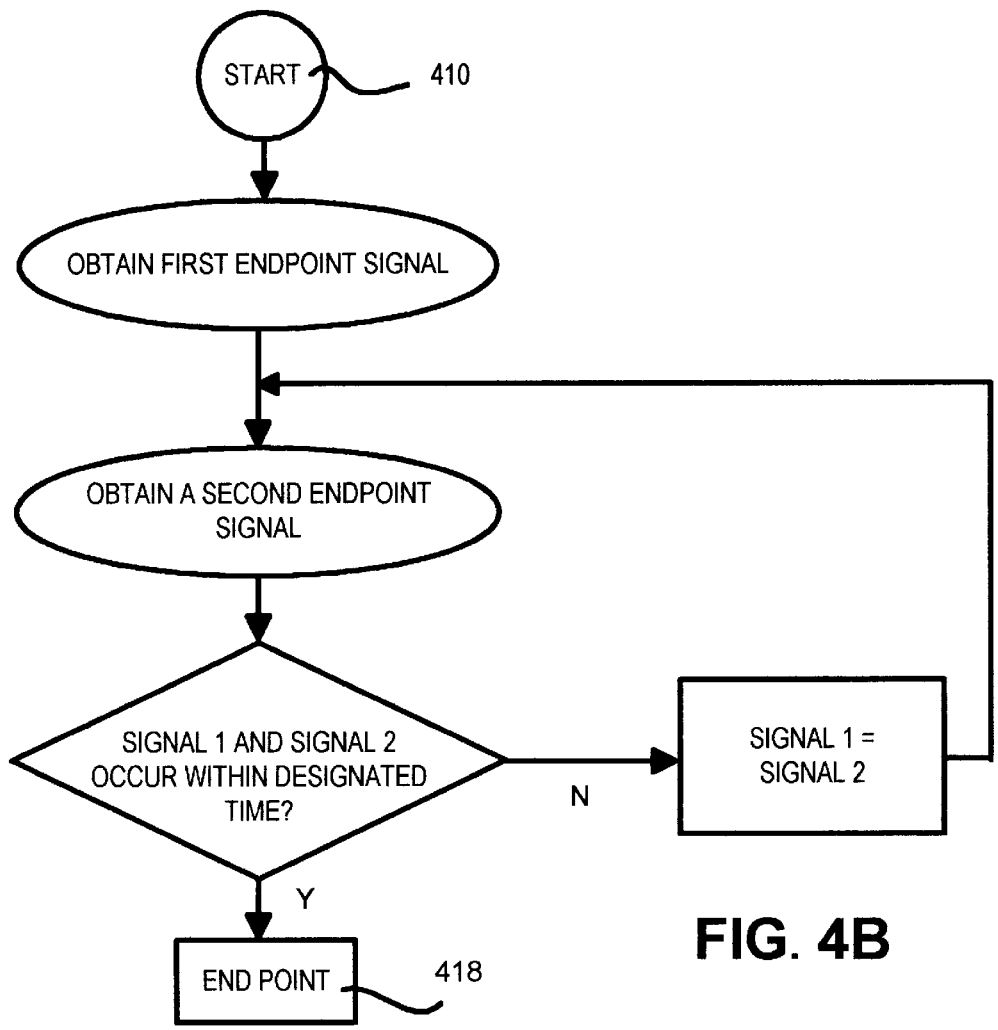

FIGS. 4A and 4B illustrate the operation of a system in which multiple independent sensors arrangements are used to determine the endpoint to the etching process. As shown in FIG. 4A, this embodiment includes an overall endpoint detection arrangement 400 that has 4 independent sensor arrangements 402a–d. It should be noted that although four independent sensors are shown, the technique works with as few as two independent sensors (which may be of the same or different types of sensors). Each of these sensors provides a signal, indicated by arrows 404a–d, to a controller 406 which controls the operation of the etching process. Each of sensors 402 may be implemented by any of the above described sensor arrangements. These include the optical emission approach described above with reference to FIG. 1, the mass analysis approach described above with reference to FIG. 2, the light absorbing approach described above with reference to FIG. 3, any other readily available sensor arrangements for detecting an endpoint.

Controller 406 includes a logic circuit which determines when the endpoint of the etching process is reached. FIG. 4B is a flow chart illustrating the operation of this logic circuit within controller 406. As shown in FIG. 4B, the function of the logic circuit of controller 406 starts at block 410 of the flow chart. Initially, as indicated by block 412, a first endpoint signal is received from one of the sensors 402a–d.

However, rather than stopping the etching process, controller 406 waits for the detection of the endpoint from another one of the sensors. This is indicated by block 414.

Controller 406 then optionally determines whether the two signals from the two sensors occurred within a designated amount of time. This is indicated by optional block 416. In this optional embodiment, the logic circuit insures that at least two independent sensors independently detect an event that indicates the endpoint of the etching process, with the two events falling within a designated period of time. Once controller 406 determines that the endpoint has been reached, as indicated by block 418, controller 406 then initiates the etch termination procedure. As mentioned earlier, the initiation procedure may cause the etch process to immediately stop or may cause the etch process to proceed an additional predefined time period to achieve a desired etch effect (e.g., overetch). If the signals from the two sensors have not been received within the designated amount of time (for example 20 seconds), the system may, in one embodiment, waits for another signal from another one of the sensors as indicated by block 420 before ascertaining whether the etch termination procedure should be initiated.

While this invention has been described in terms of several preferred embodiments, there are alterations, permutations, and equivalents which fall within the scope of this invention. For instance, although the mass analyzer of system 200 and the light source and light detector of system 300 have been described as being located adjacent to the exhaust port, this is not a requirement. Instead, the present invention would equally apply regardless of the specific location in which the various sensor arrangements are positioned. It is therefore intended that the following appended claims be interpreted as including all such alterations, permutations, and equivalents as fall within the true spirit and scope of the present invention.

What is claimed is:

1. A method for determining an endpoint for a plasma etching process, said plasma etching process being employed to etch a substrate in a plasma processing chamber, the method comprising:

detecting, using a mass analyzer, a density of a predefined compound in said plasma processing chamber;

outputting from said mass analyzer a variable signal responsive to said detecting;

producing, responsive to said variable signal, a control signal, said control signal being outputted when a predefined density criteria is detected in said variable signal; and initiating an etch termination procedure, responsive to said control signal, thereby ending said plasma etching process at an end of said etch termination procedure.

2. A method according to claim 1 wherein said plasma processing chamber includes an exhaust port for exhausting byproducts of said plasma etching process and wherein said detecting comprises ascertaining said predefined density criteria in said byproducts as said byproducts are exhausted through said exhaust port.

3. A method according to claim 1 wherein said predefined density criteria is determined by performing a plurality of test etches on test substrates.

4. A method according to claim 1 wherein said substrate is a silicon wafer.

5. A method according to claim 1 wherein said substrate is a glass panel.

6. A method according to claim 1 wherein said predefined density criteria is a density threshold.

7. A method for determining an endpoint for a plasma etching process, said plasma etching process being employed to etch a substrate in a plasma processing chamber, the method comprising:

directing a beam of light through a region of said plasma processing chamber during said plasma etching process, said region containing byproducts of said plasma etching process, compounds of said byproducts having different light absorbing characteristics;

detecting an intensity of said beam of light after said beam of light passes through said region;

generating from said detecting a variable signal representative of a density of a predefined compound of said compounds in said byproducts;

producing, responsive to said variable signal, a control signal, said control signal being outputted when a predefined density criteria is detected in said variable signal; and initiating an etch termination procedure, responsive to said control signal, thereby ending said plasma etching process at an end of said etch termination procedure.

8. A method according to claim 7 wherein said plasma processing chamber includes an exhaust port for exhausting said byproducts of said plasma etching process and wherein said directing said beam of light comprises directing said beam of light through a portion of said exhaust port.

9. A method according to claim 7 wherein said beam of light represents a laser beam having a wavelength selected to permit at least partial absorption of said laser beam by a presence of said predefined compound in said byproducts.

10. A method according to claim 7 wherein said predefined density criteria is ascertained by performing a plurality of test etches on test substrates.

11. A method according to claim 7 wherein said substrate is a silicon wafer.

12. A method according to claim 7 wherein said substrate is a glass panel.

13. A method according to claim 7 wherein said predefined density criteria is a density threshold.

14. A method for determining an endpoint for a plasma etching process, said plasma etching process being employed to etch a substrate in a plasma processing chamber, comprising:

employing a first endpoint sensor to determine a first endpoint of said plasma etching process;

employing a second endpoint sensor different from said first endpoint sensor to determine a second endpoint of said plasma etching process;

ascertaining whether said first endpoint and said second endpoint are ascertained within a predefined time period; and initiating an etch termination procedure if said first endpoint and said second endpoint are ascertained within said predefined time period.

15. The method of claim 14 wherein said first endpoint sensor employs a different sensing technology than said second endpoint sensor.

16. The method of claim 14 wherein one of said first endpoint sensor and said second endpoint sensor employs a mass analyzer.

* * * * *